United States Patent [19]

Forgey et al.

[11] Patent Number: 5,455,426
[45] Date of Patent: Oct. 3, 1995

[54] TARGET CHAMBER SHIELDING

[75] Inventors: Christian K. Forgey; Darryl A. Bennett, both of Dallas, Tex.

[73] Assignee: Texas Instruments Incorporated, Dallas, Tex.

[21] Appl. No.: 259,809

[22] Filed: Jun. 15, 1994

[51] Int. Cl.[6] .................................................. H01J 37/20
[52] U.S. Cl. .................................................. 250/492.21
[58] Field of Search .......................... 250/492.21, 398

[56] References Cited

U.S. PATENT DOCUMENTS 5,229,615 7/1993 Brune et al. ............... 250/492.21

*Primary Examiner*—Paul M. Dzierzynski
*Assistant Examiner*—Kiet T. Nguyen
*Attorney, Agent, or Firm*—Brady, III: W. James; Richard L. Donaldson

[57] ABSTRACT

A system for removal of contaminating particles from a target chamber (1) which comprises the target chamber having an aperture (3) for entry of an ion beam (2) therein, an orienting device (7, 9, 13, 15) within the target chamber for orienting a wafer (11) with respect to the ion beam and a reusable, removable shield (23), preferably of stainless steel, disposed along the interior walls of the target chamber and secured to the interior walls. A securing device (24) is provided for releasably securing the shield to the interior walls of the target chamber.

18 Claims, 1 Drawing Sheet

TARGET CHAMBER SHIELDING

CROSS REFERENCE TO PENDING APPLICATION

This application is related to Ser. No. 08/259,841, filed Jun. 15, 1994 concurrently herewith (TI-18106) for MAIN-SHAFT SHIELD, the contents of which are incorporated herein by reference.

BACKGROUND OF THE INVENTION

1. Field of the Invention

This invention relates to shielding for ion implantation chambers to reduce particle contamination within the target chamber.

2. Brief Description of the Prior Art

A standard target chamber for implantation of ions into a semiconductor wafer generally includes an aperture in a side wall thereof for entry of the ion beam into the target chamber. Within the target chamber, a reciprocatable shaft, which is vertically reciprocatable, extends through the floor of the target chamber and supports and partially positions the wafer and other wafer securing and positioning mechanisms. The positioning mechanisms include a platen to which the wafer into which ions are to be implanted is secured. The platen is secured to a motorized apparatus which rotates the face of the platen holding the wafer up to ninety degrees from an upwardly facing direction to a direction facing the aperture through which the ion beam enters the target chamber. A wafer is loaded onto the platen while the wafer holding face of the platen is directed upwardly. After loading, the wafer is rotated to face the ion beam by operation of the motorized apparatus. The motorized apparatus is secured to a motor which rotates the motorized apparatus and platen at a 45 degree angle from the horizontal plane. The entire apparatus within the target chamber rests upon the shaft which is movable in a vertical direction to position the wafer in a vertical direction relative to the ion beam. The wafer can be rotated 360 degrees about its axis.

During ion implantation, the ionized material not only lands on the target, but some also condenses on the entire assembly within the target chamber including the chamber walls and the shaft. The buildup of non-ionic condensed previously ionized material, generally but not limited to arsenic, on the walls of the target chamber results in sputtering of this condensed material by the ion beam during subsequent implant operations. The build-up of condensed material on the target chamber walls is a major cause of uncleanliness within the target chamber since the condensed material, when sputtered, can ultimately land on wafers being processed within the chamber and add to the particle count on the wafer or cause other fabrication and/or electrical problems, thereby providing an ion implantation level other than that desired or in other ways reducing production yields. This problem is presently minimized by shutting down the ion implantation equipment every few day, the time factor depending upon usage and other considerations. The ion implantation equipment is then cleaned to remove the condensed material from the target chamber walls. This cleaning operation takes about ten hours from the time the ion implantation equipment is shut down until the equipment is again operational. The cleaning process also often includes dealing with arsenic and hydrogen peroxide which, in turn, combine to produce dangerous by-products such as arsenic trioxide or arsenic pentoxide. The cleaning is performed in a non-ventilated area and requires the use of a respirator and vacuum for ventilation. It is therefore readily apparent that both economics and/or yields will be improved by preventing the condensed material from landing on wafers being processed within the target chamber as well as by introducing a more economically viable and safer system for removing condensed materials from the target chamber walls.

SUMMARY OF THE INVENTION

In accordance with the present invention, the above described problem of particle contamination is minimized and there is provided an improvement in the design of the target chamber in this regard.

Briefly, there is provided within the target chamber a shield in the form of interchangeable or replaceable walls, preferably of stainless steel, though other steels and aluminum can also be used, that are periodically replaced. The replaceable walls preferably cover all walls of the chamber except the door thereof, though, of course, the door region can also be covered. In addition, there are apertures in the interchageable walls to accommodate the ion beam and any other instrumentation such as, for example, a cryopump, sensors and the like. The reason for preferably omitting an interchangeable wall at the door is to allow for viewing of the interior of the target chamber and to permit ready access to the target chamber interior. The above described procedure allows for the retrofit of duplicate shields during an ion source change, which also occurs periodically. The result is that there is no extra machine down time or personnel usage required for scraping the target chamber walls. The shielding is changed in minutes and, after the shield is removed from the target chamber and a clean shield installed, the target chamber is immediately available for use with the same or a different ion source. Meanwhile, the contaminated shield is cleaned by use of a wet blaster or the like. This process is much safer than the prior art technique described above and poses no threat to the person cleaning the shielding. The clean shields are then reused when required.

DESCRIPTION OF THE PREFERRED EMBODIMENT

Figure 1:
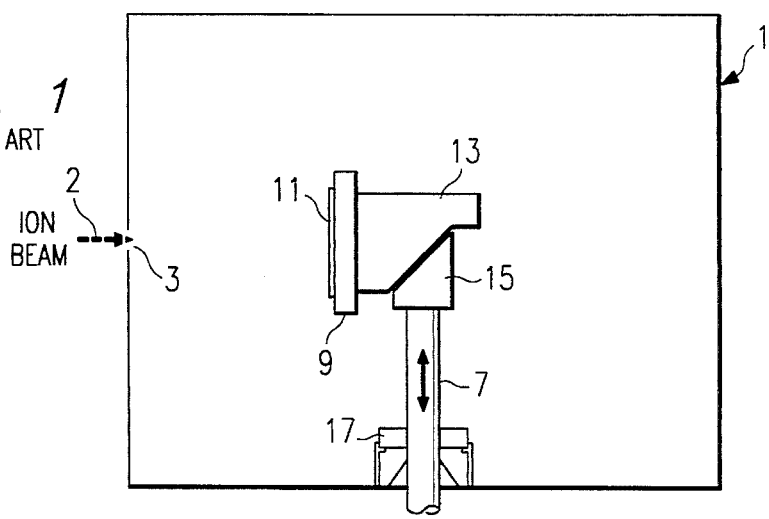
FIG. 1 is a schematic diagram of a side view of a prior art target chamber for implanting ions into semiconductor wafers.

Referring first to FIG. 1, there is shown a standard target chamber 1 for implantation of ions from an ion beam 2 into a semiconductor wafer 11. The target chamber 1 includes an aperture 3 in a side wall thereof for entry of the ion beam 2, such as, for example, arsenic ions, into the chamber. A reciprocatable shaft 7, which is vertically reciprocatable as shown by the arrow, extends through the floor of the target chamber 1 and supports and partially positions the wafer and other wafer securing and positioning mechanisms as will now be described.

Positioned within the target chamber 1 is a wafer 11 secured to a platen 9. Ions from the ion beam 2 are to be implanted into the wafer 11. The platen 9 is secured to a rotating mechanism 13 which rotates the portion of the wafer 11 along a 360 degree path. A motorized apparatus 15 rotates the rotating mechanism 13 up to ninety degrees from an upwardly facing direction to a direction facing the aperture 3 so that the wafer 11 is properly positioned with respect to the aperture 3 and ion beam 2 for implant in the proper location in the wafer. In this way, a wafer 11 can be loaded onto the platen 9 while the wafer holding face of the platen is directed upwardly. Accordingly, motor 15 rotates the rotating apparatus 13 and platen 9 to the implant position facing toward the aperture 3 and the rotating apparatus 13 rotates the position of the wafer 11 in a 360 degree orientation. The entire apparatus within the target chamber 1 rests upon the shaft 7 which is movable in a vertical direction to position the wafer in a vertical direction relative to the ion beam. The door to the target chamber 1 is not shown in FIG. 1.

During ion implantation, the ionized element not only lands on the target, but some of the ionized element also condenses on the entire assembly within the target chamber 1 including the chamber walls and the shaft 7. The build-up of particles of condensed material on the target chamber walls is a major cause of uncleanliness within the target chamber since the condensed material can ultimately be sputtered by the ion beam and land on wafers being processed within the chamber. This sputtered material, when landing on a wafer being fabricated, adds to the particle count in the wafer or causes other problems, thereby providing an ion implantation level other than that desired or in other ways reducing production yields.

Figure 2:
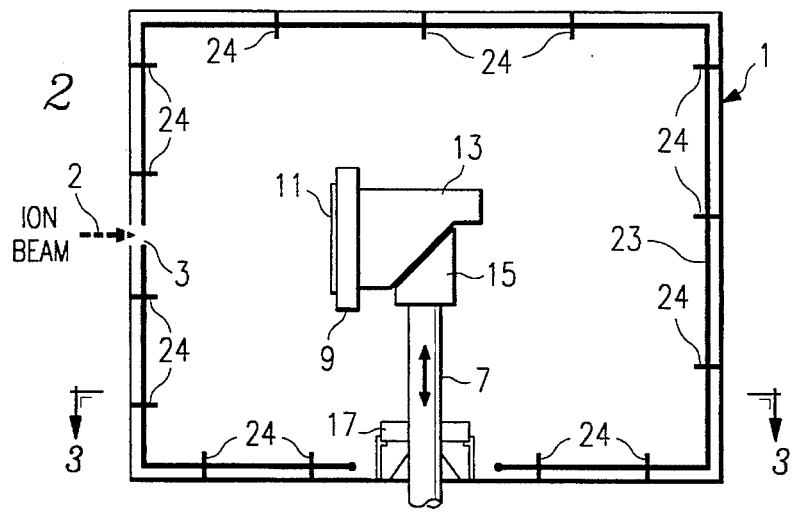
FIG. 2 is a schematic diagram of the target chamber of FIG. 1 with the shield in accordance with the present invention disposed within the target chamber.
Figure 3:
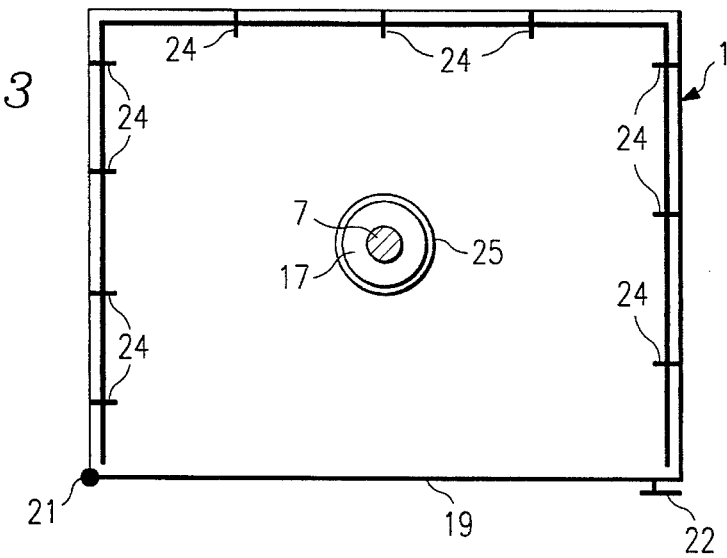
FIG. 3 is a view taken along the line 3—3 of FIG. 2.

Referring now to FIGS. 2 and 3, there is shown the target chamber 1 as in FIG. 1 with the door 19 to the chamber secured by a hinge 21. A handle 22 is used to open and close the door 19 in standard manner. The door 19 can have a transparent section (not shown) for viewing the interior of the target chamber 1. A shield 23 of stainless steel is disposed within the target chamber and covers all of the interior walls of the chamber with the exception of the door 19, as shown. The shield 23 is secured to the chamber interior walls using spring plungers 24 to releasably hold the shield to the walls. The shield 23 can optionally also cover the door 19. The shield 23 also includes an aperture at the location of the aperture 3 in the target chamber 1 so that the ion beam 2 can enter the interior of the target chamber. An aperture is also provided in the floor portion of the shield 23 so that the shaft 7 can pass therethrough during reassembly after removal of a prior shield. Other apertures (not shown) are provided to accommodate other equipment, such as a cryopump, sensors and other instrumentation or equipment.

In operation, when the build-up of material on the shield 23 becomes sufficiently significant to require removal, the shield is removed and replaced with a new shield. The door 22 is meanwhile removed and cleaned or replaced if there is no shield thereon or the shield thereon is also removed if such shield is being used. The reason for making the shield on the door optional is that the door is easily removed for cleaning and therefore does not significantly add to down time of the device. Accordingly, the removed shield can now be cleaned for reuse without extensive shut down the equipment while the cleaning is carried out.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A system for removal of contaminating particles from a target chamber comprising:
    (a) a target chamber having an aperture for entry of an ion beam into said target chamber and interior walls;
    (b) means within said chamber for orienting a wafer with respect to said ion beam; and
    (c) a removable shield disposed along the interior walls of said target chamber and secured to said interior walls.

2. The system of claim 1 wherein said shield is reusable.

3. The system of claim 2 wherein said shield consists essentially of steel.

4. The system of claim 3 further including a securing device for releasably securing said shield to said interior wall.

5. The system of claim 4 wherein said securing device is a spring plunger.

6. The system of claim 2 wherein said shield consists essentially of stainless steel.

7. The system of claim 6 further including a securing device for releasably securing said shield to said interior wall.

8. The system of claim 7 wherein said securing device is a spring plunger.

9. The system of claim 2 further including a securing device for releasably securing said shield to said interior wall.

10. The system of claim 9 wherein said securing device is a spring plunger.

11. The system of claim 1 wherein said shield consists essentially of steel.

12. The system of claim 11 further including a securing device for releasably securing said shield to said interior wall.

13. The system of claim 12 wherein said securing device is a spring plunger.

14. The system of claim 1 wherein said shield consists essentially of stainless steel.

15. The system of claim 14 further including a securing device for releasably securing said shield to said interior wall.

16. The system of claim 15 wherein said securing device is a spring plunger.

17. The system of claim 1 further including a securing device for releasably securing said shield to said interior wall.

18. The system of claim 17 wherein said securing device is a spring plunger.

* * * * *